United States Patent [19]

Cheng et al.

[11] Patent Number: 5,853,958
[45] Date of Patent: Dec. 29, 1998

[54] LITHOGRAPHIC PLATE WITH DISPERSE PARTICULATE RUBBER ADDITIVE

[75] Inventors: Chieh-Min Cheng, Arlington; Anthony C. Giudice, Wakefield; Rong-Chang Liang, Newton; William C. Schwarzel, Billerica; Leonard C. Wan, Chestnut Hill, all of Mass.

[73] Assignee: Polaroid Corporation, Cambridge, Mass.

[21] Appl. No.: 732,899

[22] Filed: Oct. 17, 1996

Related U.S. Application Data

[60] Division of Ser. No. 531,486, Sep. 21, 1995, Pat. No. 5,616,449, which is a continuation-in-part of Ser. No. 146,479, Nov. 1, 1993, abandoned.

[51] Int. Cl.$^6$ .............................. G03F 7/033; G03F 7/038
[52] U.S. Cl. ...................... 430/286.1; 430/281.1; 430/287.1; 430/288.1; 430/284.1; 430/907; 430/910; 430/949; 430/912; 522/121
[58] Field of Search ............................. 430/281.1, 287.1, 430/286.1, 288.1, 284.1, 907, 910, 949, 912; 522/121

[56] References Cited

U.S. PATENT DOCUMENTS

| | | | |
|---|---|---|---|
| 3,701,748 | 10/1972 | Kroekel | 260/40 |
| 3,772,241 | 11/1973 | Kroekel | 260/40 |
| 4,273,851 | 6/1981 | Muzyczko | 430/175 |
| 4,357,413 | 11/1982 | Cohen et al. | 430/253 |
| 4,408,532 | 10/1983 | Incremona | 101/456 |
| 5,238,783 | 8/1993 | Taniguchi et al. | 430/281.1 |
| 5,258,263 | 11/1993 | Cheema et al. | 430/302 |
| 5,344,744 | 9/1994 | Ueda et al. | 430/287.1 |
| 5,368,973 | 11/1994 | Hasegawa | 430/138 |
| 5,395,734 | 3/1995 | Vogel et al. | 430/270.1 |

FOREIGN PATENT DOCUMENTS

75344/91  11/1991  Australia ............................. 430/281.1

OTHER PUBLICATIONS

*Grant & Hackh's Chemical Dictionary. Fifth Ed.* Ed. Grant, Roger & Claire Grant; McGraw–Hill, New York, (1987) pp. 192, 210, 424, 447, and 511.

*Primary Examiner*—Cynthia Hamilton
*Attorney, Agent, or Firm*—Renato M. de Luna

[57] ABSTRACT

The present invention discloses the use of rubber and surfactant to enhance the durability and resolution of on-press developable lithographic printing plates. The rubber is preferably incorporated into a photoresist as discrete particulate rubber. To ensure a uniform and stable dispersion, the rubber is suspended in the photoresist by means of a surfactant having an HLB approximately between 7.0 and 18.0.

9 Claims, No Drawings

LITHOGRAPHIC PLATE WITH DISPERSE PARTICULATE RUBBER ADDITIVE

This application is a division of application Ser. No. 08/531,486, filed Sep. 21, 1995, now U.S. Pat. No. 5,616, 449 which is a continuation-in-part of application Ser. No. 08/146,479, filed Nov. 1, 1993, and now abandoned.

FIELD OF THE INVENTION

The present invention relates generally to photoresist compositions suitable for on-press development, and more particularly, to the incorporation of dispersed rubber additives in the photoresists of lithographic printing plates for the purpose of promoting their on-press developability.

CROSS-REFERENCE TO RELATED PATENTS AND APPLICATIONS

U.S. Pat. No. 5,516,620, describes a lithographic printing plate for use on a printing press, with minimal or no additional processing after exposure to actinic radiation. The plate comprises a printing plate substrate, a polymeric resist layer capable of imagewise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or may be coated onto a separate substrate capable of being brought into face-to-face contact with the resist layer.

U.S. Pat. No. 5,514,522 describes a photoreactive polymeric binder that may be used to enhance photospeed in either conventional plates or on-press developable lithographic printing plates. Briefly, a polymer of m-isopropenyl-α, α-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-α, α-dimethylbenzyl isocyanate through complexation with an electron-deficient monomer such as maleic anhydride to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion.

U.S. patent application Ser. No. 08/147,044 (see U.S. Pat. No. 5,607,816) discloses the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability.

The disclosures of the aforementioned applications are hereby incorporated by reference.

BACKGROUND OF THE INVENTION AND DESCRIPTION OF THE PRIOR ART

At the present time, virtually all printed copy is produced through the use of three basic types of printing plates. One type is a relief plate which prints from a raised surface. Another type is an intaglio plate which prints from a depressed surface. The third type is the lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric layer (i.e. photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a "softening" or solubilization of the photoresist.

After photoexposure, a wet development step is normally conducted. The objective of such wet development is to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional solvent-based lithographic plates prior to their use on a printing press is time and labor consuming and involves the use of substantial quantities of organic chemicals. It will be appreciated that there is considerable attractiveness for innovations that would satisfactorily eliminate or reduce conventional lithography's long-felt dependency upon the conduct of wet development and thereby permit the use of solvent-based lithographic plates on a printing press immediately after exposure without required intermediary processing.

In the past, dry developable lithographic printing plates have been suggested which enable the wet processing steps of lithographic printing plates after exposure to be omitted and printing to be conducted by directly mounting the exposed plates on a printing press. Among printing plates that may be characterized as on-press developable (or related thereto) are: e.g., U.S. Pat. No. 4,273,851, issued to Muzyczko et al. on Jun. 16, 1981; U.S. Pat. No. 5,258,263, issued to Z. K. Cheema, A. C. Giudice, E. L. Langlais, and C. F. St. Jacques on Nov. 2, 1993; and U.S. Pat. No. 5,395,734, issued to Vogel et al. on Mar. 7, 1995.

Despite the methodologies and approaches embodied in the aforementioned patents, there is a continuing need for a lithographic printing plate that can be readily developed on a printing press and that produces a plate having durable image areas needed for good run length. Difficulty in the realization simultaneously of both "on-press developability" and "durability" is believed to originate from an apparent contradiction between photoresist removability ("developability") on the one hand and "durability" on the other: To make a photoresist more durable was to make the photoresist less developable.

In designing an on-press developable plate, the goals of "developability" and "durability" are often competing. For example, it has been found that good developability may be achieved by increasing the affinity of the resist to fountain and ink solutions, thus promoting a faster rate of penetration of such press solutions into the photoresist. Alternatively, it has also been found that good developability may be achieved by increasing the volume of the photoresist composition deposited above the hydrophilic substrate. Regardless, it has been observed that both modifications, standing alone, invariably tend to increase the tackiness of the printing plate, and thus, reduce its durability.

While it is possible to more closely align the goals of "durability" and "developability" by the utilization of comparatively greater concentrations of binder compositions capable of effectively serving as both a matrix and a photoreactive component (see, U.S. Pat. No. 5,514,522, and/or by the use of fountain leachable plasticizers (see, U.S. Pat. No. 5,607,816, an additional means has been found which is capable of promoting "durability" without effecting significant losses of "developability". Gains in resolution have also been observed.

More specifically, it has been found that dispersed hydrophobic rubber components may be effectively incorporated by the use of surfactants into a photoresist to durabilize and detackify the photoresist, thereby making such photoresist more suitable for on-press use. While rubbers have been disclosed for use in conventional printing plates, the use of rubber materials to advance the goals of on-press developability has not been foreshown. On-press developability imposes certain limitations that would belie obvious translation of conventional uses. Unlike conventional lithography wherein there exists greater latitude for the selection and conduct of development materials and processes, on-press development techniques are in great part constrained by the several process parameters necessary to achieve satisfactory on-press development, such as the use of "weaker" developers and compatibility with the printing press environment. Although these parameters vary among the different on-press modalities, the character, configuration and function of the developers are typically of great concern. Accordingly, the use of hydrophobic rubber additives in an on-press system was counterintuitive under conventional teachings, since to make the resist more hydrophobic would have been to narrow an already narrowly constrained means of development. Accordingly, no known on-press technologies have incorporated rubber as a means to enhance the durability of photoresists.

Departing from prevailing ideas, the present invention is able to strike a balance between the competing goals of durability and developability in a system wherein rubber additives are incorporated to effectively enhance the durability of a photoresist, but configured to minimize interference with potential on-press development systems. Briefly, this is preferably accomplished by incorporating rubber additives as discrete particles stably suspended in the photoresist by the agency of suitable surfactants. Lithographic printing plates utilizing the dispersed particulate rubber system manifests good durability, developabilty and resolution.

While applicants do not wish to be bound to any particular mechanism in explaining the functionality of the preferred dispersed particulate rubber system, it is believed that a number of factors are involved. Briefly, durability is effected by improving adhesivity and resistance to external stress; developability is effected by the dispersed and particulate configuration of the rubber; and resolution was effected by rubber's hydrophobicity.

With regard to durability, it is noted that the durability of a lithographic printing plate, (i.e., the capacity of a printing plate to be run continuously on a printing press without significant loss of resolution), is positively correlated with adhesivity of the photoresist to its underlying substrate: i.e., if the resist is well adhered to the substrate, the printing plate can maintain longer press runs. Good adhesion is best achieved when internal stress in the photoresist is reduced to a minimum level. However, high levels of internal stress are generated when the photoresist shrinks due to the extremely fast rate of monomer polymerization relative to the rate of relaxation of crosslinked binders. Shrinkage is especially pronounced in photoresists that utilize lesser concentration of binder as a trade-off for enhanced developability.

The incorporation of discrete rubber particles in the photoresist reduces shrinkage. During polymerization, the dispersed rubber particles are believed to expand as a result of temperature increases and swelling caused by absorption of unreacted monomers. The expansion of the particulate rubber phase is believed to compensate the shrinkage of the surrounding continuous resist phase. In designs utilizing solvent-soluble, phase-separable rubbery additives (discussed below), compensation is accomplished when the rubbery materials separate from its polymer matrix to form discrete domains.

Aside from compensating for shrinkage, the durability of a printing plate is also believed to be enhanced by virtue of the mechanical properties of rubber, e.g., compressibility, flexibility and elasticity. When run on a printing press, the compressive and rotational forces generated by the press rollers tend to disfigure, erode or otherwise damage the surface of the plate and any coatings deposited thereon. By the use of dispersed rubber additives, it is believed that crazing and/or shear banding mechanisms are promoted, thus providing avenues for the non-disruptive release of externally imposed stresses.

With the capacity to enhance durability, dispersed particulate rubber materials make practical the use of thinner photoresists that are more permeable to developers and press solutions. Regardless, even without modifying photoresist thickness, the preferred embodiment of the present invention effectively maintains the developability of the photoresist by virtue of the particular configuration of the rubber additives. Both dispersed and particulate in character, the rubber additives offer minimal interference with the penetration of developers and fountain solutions.

Finally, with regard to resolution, the incorporation of rubber into a photoresist significantly raises its hydrophobicity. Greater levels of hydrophobicity translate into greater ink transfer efficiency from the plate to a receiving medium, such as paper. Together with the enhanced durability of exposed highlight areas, the greater ink transfer efficiency increases the resolution of the printing plate.

SUMMARY OF THE INVENTION

The present invention provides the use of rubbers and surfactants to enhance the durability and resolution of on-press developable lithographic printing plates. The rubbers are preferably incorporated into a solvent-based photoresist as discrete rubber particles. To ensure a uniform and stable dispersion, the rubber components are suspended in the solvent-based photoresist by means of surfactants having an HLB approximately between 7.0 to 18.0 (preferably between 9.0 to 13.0).

Several methods may be used to prepare the rubber component. Preferred methods are those that result in the formation of highly cross-linked discrete rubber particles. In this regard, a preferred method for preparing the rubber component involves the polymerization of a dispersion of polymerizable monomers in an organic solvent in the presence of initiators, cross-linking agents and polymer stabilizers. The resulting dispersion may be incorporated into polymeric resists, together with suitable surfactants, to reduce the tackiness of the lithographic printing plate as well as improve image resolution and run length.

In light of the above, it is an object of the present invention to provide a mechanism by which solvent-coated photoresists of lithographic printing plates may be made more durable, capable of better resolution, and with minimized barriers to developability.

It is another object of the present invention to provide an organic solvent-based photoresist composition suitable for use as a photoresist in an on-press developable lithographic printing plate, the photoresist composition comprising in an organic solvent a photopolymerizable, photocrosslinkable or photorearrangeable compound capable of promoting solubilization or hardening of the photoresist in areas of exposure to actinic radiation; a hydrophobic macromolecular organic binder; a particulate rubber incorporated into the photoresist composition as a stable dispersion, and a surfactant having a concentration and an HLB value effective for stably dispersing the particulate rubber.

It is another object of the present invention to provide a method for lithographically printing images on a receiving medium, the method utilizing a printing press, the printing press provided with fountain and ink solutions, the method comprising the steps of incorporating a polymeric rubber and a dispersing agent into a photoresist composition, the photoresist composition comprising in an organic solvent at least a hydrophobic macromolecular organic binder and a photopolymerizable monomer, the polymeric rubber incorporated into the photoresist composition as a stable dispersion, the dispersing agent being a surfactant having a concentration and an HLB value effective for stably dispersing the polymeric rubber in the photoresist composition; depositing the photoresist composition onto a lithographic printing plate substrate to provide a photoresist thereon, the photoresist capable of being photohardened upon imagewise exposure to actinic radiation, the polymeric rubber being dispersed in the photoresist; imagewise exposing the photoresist to actinic radiation to cause the photopolymerizable monomer in exposed areas to polymerize and thereby cause exposed areas of the photoresist to imagewise photoharden; treating the photoresist with fountain and ink solutions in a printing press, wherein the fountain and ink solutions penetrate into the photoresist through the dispersed polymeric rubber causing removal of unexposed areas of the photoresist and correspondingly baring the underlying substrate, whereby ink becomes imagewise localized in either unremoved photoresist or bared substrate to form an imagewise distribution of ink transferable to a receiving medium, such as paper.

It is another object of the present invention to provide a rubber dispersion that may be used as an additive in photoresist systems to reduce tackiness of printing plate without sacrificing on-press developability.

It is another object of the present invention to provide an on-press developable lithographic printing plate having enhanced image resolution as well as being more durable and easily developed on-press.

DETAILED DESCRIPTION OF THE INVENTION

Throughout this disclosure the term "on-press" is used to describe both development and printing plates, (e.g. "on-press development", "developing on-press", "on-press developable lithographic printing plates", etc.) As used herein, the modifier "on-press" will be defined as indicating an ability to develop a useful imagewise distribution of oleophilic and hydrophobic polymeric areas on a printing press after imagewise exposure, without resort to wet development steps or like intermediary processing. "On-press" techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

The present invention provides several product and method embodiments designed to enhance the durability, developability and resolution of on-press developable lithographic printing plates, particularly on-press plates that are developed with high-boiling, low-vapor developers and/or press solutions. The present invention provides a dispersed phase system that is generally embodied as a rubber/surfactant system which may be incorporated into a solvent-based photoresist comprising a binder and a photopolymerizable, photocrosslinkable, or photorearrangeable compound (typically, a polymerizable monomer), and an initiator system.

As formulated, the photoresist having therein the rubber/surfactant system may be deposited above the substrate of an on-press lithographic printing plate. Upon photoexposure, exposed regions of the printing plate's photoresist are hardened by the effects of polymerization of the polymerizable monomer and by graft polymerization, if any, involving the polymeric binder. In a preferred embodiment, rubber stabilized by surfactants remain suspended as discrete particles in the photoresist such that developing agent may freely penetrate and diffuse around the rubber particles. The resulting printing plate may be more easily developed through conventional on-press methods or through the processes described in detail in the applications cross-referenced above.

According to an initial design, a liquid reactive rubber polymer is dispersed in a photoresist composition by the use of a surfactant having an HLB approximately between 7.0 to 18.0 (preferably between 9.0 to 13.0). The liquid reactive rubbers are added into the photoresist composition in concentrations of approximately 3–5% (by dry weight). Reactive rubbers include any variety of rubber and rubber-like polymeric materials capable of incorporation into a pre-exposed photoresist and which will undergo phase separation upon exposure of the photoresist to actinic radiation and the concomitant physical and chemical alteration of said photoresist. Examples of reactive rubbers include Hycar 1300×33 (an acrylated nitrile butadiene from BF Goodrich) and PBD-300 (an acrylate terminated butadiene from Atochem, Inc.). Tackiness of plates utilizing liquid rubber was approximately 70 g/m as determined by a Peel Adhesion Tester.

In the preferred embodiments, discrete rubber particles are substituted for the liquid reactive rubber polymer. In contrast to reactive rubbers which form discrete domains as a function of actinically-activated phase-separation, the discrete rubber particles are incorporated into the photoresists pre-synthesized as discrete particles. The discrete rubber particles may be prepared several ways, examples of which are described below. Tackiness of the plates utilizing discrete rubber particles was approximately 30–40 g/m as determined by the Peel Adhesion Tester.

Any variety of rubber and rubber-like polymeric materials that can be provided in a particulate form and which are dispersible in a photoresist composition suited to production of a lithographic printing plate may be used. Examples of rubber materials include natural rubber; polyisobutylene; butadiene rubber; styrene-butadiene rubber; nitrile rubber; chloroprene rubber; acrylic elastomers such as copolymers of ethyl acrylate, butyl acrylate, and 2-ethyl hexyl acrylate; ethylene copolymers such as ethylene/vinyl acetate, ethylene/acrylate, ethylene/propylene, ethylene/propylene/butadiene, etc.; and the like. Preferred rubbers are acrylated nitrile butadienes (e.g., Hycar 1300×33 from B. F. Goodrich); acrylated grafted butadienes (e.g., Riacryl), acrylate grafted chloroprene, acrylate terminated butadienes (e.g., PBD-300 from Atochem, Inc.), butadiene rubber latices, and isoprene rubber latices. Rubber particle compositions are generally added in concentrations of approximately 1 to 8% (dry weight), and in preferred embodiments, 2–5% (dry weight).

The surfactant that may be used with present invention are preferably those having an HLB ratio of between 7.0 to 18.0 (preferably between 11.5 to 12.5). Examples of preferred surfactants are as follows: block copolymers of propylene oxide and ethylene oxide (such as Pluronic L43, L64, P103, 10R5, 1107, 17R4, and 25R4 from BASF); polyethoxylated alkylphenols; and polyethoxylated fatty alcohols (such as Triton DF-18, DF-16 and X-14, from Rohm & Haas, Tergitol NP-8, TMN-6, 15-S-7 and NP-7, from Union Carbide, Igepal CA-620, CO-610, DM-530 and RC-520, from Rhone-Poulenc). As ionic surfactants tend to be incompatible with fountain solution, nonionic surfactants are generally preferred. As an alternative to surfactants, other equivalent dispersing agents capable of effectively dispersing the rubber components may be utilized. Surfactant may be added in concentrations of approximately 0.5–10%, and in preferred embodiments, 2–5%.

In the preferred embodiment, the dispersed rubber particles should have an average size around 0.05 to 5.0 $\mu$m and even more preferably around 0.1 to 1.0 $\mu$m. This may be accomplished through a number of methods.

Under a preferred method of preparation, crosslinked rubbery dispersions are prepared by known dispersion polymerization techniques, such as those described in *Dispersion Polymerization in Organic Media*, K. E. J. Barret ed., Wiley, London 1975, Chapter 5, page 201–241. Briefly, rubber monomers are polymerized in an organic solvent in the presence of initiators, crosslinking agents and dispersing agents to stabilize the resulting rubber particles. Preparation is conducted in an organic solvent since water is not fully compatible with the hydrophobic photoresist, the hydrophobic photoresist also being prepared in an organic solvent.

In a representative synthesis, two hydrophobic acrylate monomers, n-butyl acrylate and 2-ethylhexyl acrylate, were utilized with divinyl benzene. Dispersion polymerization of n-butyl acrylate/divinylbenzene or 2-ethylhexyl acrylate/divinylbenzene in alcohols produced particles with sizes ranging from 0.3 to 0.8 $\mu$m depending on the concentration of the initiator, the type and concentration of the polymeric stabilizer, the polymerization temperature, and the solvency of the reaction media. Polymeric stabilizers which were found effective in these dispersion polymerizations include poly(vinyl pyrrolidone) (Mw~40,000 and 360,000 g/mole), hydroxypropyl cellulose (Mw ~100,000 g/mole), and Hypermer PS3 (a polyester/polyamine copolymer, ICI). It is noted that co-stabilizers, such as Aerosol OT (a dialkyl ester of sodium sulfosuccinic acid, from American Cyanamid) or Pluronic P103, were found effective in enhancing the stability of the dispersions. It is further noted that the crosslinking density of the dispersions can be controlled by the concentration of the divinylbenzene in the reaction mixture. Polymer particles with ~15 wt % divinylbenzene content demonstrated the highest press durability among these acrylate dispersions.

As one alternative to the dispersion polymerization method, the particulate rubber phase may also be prepared by converting the reactive liquid rubber polymers of the first embodiment into an artificial rubber dispersions in an organic media. This process generally involves the dissolution of rubber polymer, crosslinking agent (e.g. sulfite or thiol), initiator, and monomers (e.g. divinylbenzene, methyl methacrylate, ethyl methacrylate or methacrylic acid) in an organic solvent (e.g. methyl ethyl ketone) and the mechanical dispersion of the polymer solution in an alcoholic mixture of emulsifiers, followed by polymerization. Details of this process may be found in *Preparative Methods of Polymer Chemistry*, Inter-science Publishers, New York, 1968, Second Edition, by W. R. Sorenson and T. R. Campbell.

Examples of commercially reactive rubber polymers that can be converted into rubber dispersions include: Ricacryl (an acrylate grafted polybutadiene), Hycar 1300×33 (a carboxyl-terminated poly(butadiene/acrylonitrile/acrylic acid)terpolymer), and PBd-300 (an acrylate terminated polybutadiene). Using ionic emulsifiers/fatty alcohol mixtures or polyester stabilizers, stable rubber dispersions in alcohols with an average particle size ranging from 0.4 to 0.7 $\mu$m can be prepared. The dispersion particle size is controlled by the type, ratio and concentration of the mixed emulsifiers or stabilizers. It is noted that hydrophobicity of the plates is increased with increasing crosslinker content. It is also noted that adhesion between the rubber dispersion and the photopolymer in the printing plate formulation is strongly effected by the extent of grafting of the rubber.

Other alternative methods exist. For example, rubber dispersions may be prepared by grinding powdered, crosslinked rubbers in organic solvents in the presence of polymeric dispersants. Highly grafted rubber dispersions may also be prepared by graft polymerization of vinyl monomers (such as acrylates, methacrylates and styrene monomers) onto an unsaturated rubbery polymer.

Regardless of the method of preparation, the rubber component is incorporated with suitable surfactants into a photoresist typically comprising at least a binder, a polymerizable monomer, and an initiator. The photoresist is prepared from a photoresist composition comprising the stated ingredients in an organic solvent, such as methyl ethyl ketone. As a solvent based resist, when developed on-press, remnants of the removed resist will be "taken up" by the press ink solution. Accordingly, contamination of the press fountain solution (and the concomitant degradation of print quality) is avoided.

The polymerizable monomer may include any variety of compounds, mixtures, or mixtures of reaction compounds or materials capable of being physically altered by photoexposure or of promoting physical alteration (e.g., hardening) of the properties of the layer in areas of photoexposure. Compounds and materials suitable for this purpose include monomeric photopolymerizable compounds which undergo free-radical or cation-initiated addition polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated addition polymerization. Examples of such unsaturated compounds include acrylates, acrylamides, methacrylates, methacrylamides, alkyl compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyanopentoic acid, although others can be employed.

The practical concentration of the monomer or monomers employed is about 7.5%–70% by weight based on the total solids of the composition, and preferably between 15–40%.

In contrast to the comparatively lower preferred concentrations of photosensitive monomer, the principal component of the polymeric photoresist for most plates is a solvent-soluble hydrophobic binder of suitable oleophilicity and ink receptivity. Suitable binder materials include: vinylidene chloride copolymers (e.g., vinylidene chloride/ acrylonitrile copolymers, vinylidene chloride/ methylmethacrylate copolymers and vinylidene chloride/ vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/ acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

The photoresist composition of the present invention can be suitably coated into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

To prepare a lithographic plate according to the present invention, the photoresist composition is coated as a layer onto a substrate. Certain factors are considered in determining the appropriate materials for the substrate. Such factors vary with the particular lithographic needs of individual projects and are believed to be within the grasp of one skilled in the pertinent art. Regardless, for most lithographic needs envisioned, suitable substrates will generally include those to which the polymeric resist layer can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photoresist, or to increase the hydrophilic properties of the substrate material, and/or to improve the developability of the photosensitive coating, as is described in the U.S. Pat. No. 4,492,616 (issued Jan. 8, 1985 to E. Pliefke, et al.). Thus, the substrate can be treated (for example, by polyvinylphosphonic acid or silicate or by anodization, or by corona discharge or plasma treatment, or by roughening or graining treatment) to promote desired adhesion of any polymeric resist layers.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicone rubbers and metallized plastic sheets such as those based on poly (ethylene terephthalate).

Preferred plates are the grained, anodized aluminum plates, where the surface of the plate is roughened mechanically or chemically (e.g., electrochemically) by a combination of roughening treatments. Anodized plates can be used to provide an oxide surface. Other desirable plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); the aforementioned U.S. Pat. No. 4,492,616 issued to E. Pliefke, et al; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photoresist compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plates can be accomplished according to the requirements dictated by the particular composition of the polymeric photoresist and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in exposed (or non-exposed) areas by developers. It will be appreciated, as stated above, that the use of the dispersed particulate rubber of the present invention enables the use of comparatively thinner photoresists. When utilizing an anodized, grained aluminum substrate, good results are obtained by using a polymeric photoresist having a thickness in the range of from about 0.2 microns to about 3 microns above the microstructure of the grains, preferably about 0.2 to 0.6 microns "above the grain".

A polymeric photoresist can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

In addition, the operability of the polymeric photoresist may be improved by the addition of certain additives. For example, the polymeric photoresist can contain plasticizers, additional hardeners, or other agents to improve coatability. The polymeric photoresist may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl) propionate} methane; diesters of thiodipropionic acid, triarylphosphite. While the use of such additives is unnecessary for the operability of the present invention, incorporation of such additives may dramatically enhance performance.

The plasticizers, contrast dyes, imaging dyes and other additives may be microencapsulated and incorporated into the photoresist itself or a separate layer facially positioned or positionable atop the photoresist. Inclusion in the microcapsules would provides a wider latitude in the selection of such additives, since neither the solubility of the additives in the photopolymerizable compositions nor the inhibition or retardation effect of some additives on polymerization would be an issue in such a system.

Development of a photoexposed plate of the invention can be accomplished in a number of ways, depending upon the particular nature of the photoresist employed. For example, in the case of a negative-working photoresist based upon photopolymerizable ethylenically unsaturated monomers, conventional wet development can be employed using a diluted alkaline solution containing preferably up to 10% by volume of organic solvents. Examples of useful alkaline compounds include inorganic compounds such as sodium hydroxide, potassium hydroxide, lithium hydroxide, sodium benzoate, sodium silicate and sodium bicarbonate; and organic compounds such as ammonia, monoethanolamine, diethanolamine and triethanoloamine. Water-soluble organic solvents useful as developers include isopropyl alcohol, benzyl alcohol, ethyl cellosolve, butyl cellosolve, diacetone alcohol, and the like. Depending on the particular needs, the developing solution may contain surfactants, dyes, salts for inhibiting the swelling of the photoresist, or salts for corroding the metal substrate.

As another means of development, it is noted that embodiments of the present invention may be operably on-press developed without any further treatment after exposure, development being accomplished on the printing press by the action of fountain solution and lithographic ink. In particular, using for example the methods of offset lithography, the printing plate plate can be mounted on a plate cylinder of the press which, as it rotates, comes into contact successively with rollers wet by a fountain solution and rollers wet by ink. The fountain and ink solution (sprayed or otherwise deposited onto dampening rollers and inking rollers, respectively) contacts the plate, leading to the aforediscussed interaction of the fountain and ink solutions with the rubber additive of the photoresist. Ultimately, the fountain solution contacts the non-printing areas of the plate and prevents ink from contacting these areas. The ink likewise contacts the image areas and is subsequently transferred to an intermediate blanket cylinder. The inked image is transferred to the recieving medium (e.g., paper) as it passes between the intermediate blanket cylinder and an impression cylinder.

While the on-press developable plates of the present invention are suitable for many printing applications, the plates can be improved in respect of on-press developability by suitably modifying the photoresist composition or treating the photoresist layer for improved removability on the press. For example, good results may be accomplished using the dispersed rubbers of the present invention in a photoresist that is in contact or brought into contact with the microencapsulated developer systems described in U.S. Pat. No. 5,516,620. The photoresist may also incorporate a plasticizing system and a photoreactive polymeric binder, as described in the above cross-referenced U.S. patent application Ser. No. 08/147,044 and U.S. Pat. No. 5,514,522. See, Example 9,infra, for a representative example. Combination with these on-press development systems is the suggested mode of utilization.

The present invention will now be described in further detail by the following non-limiting examples of several of its embodiments. In the examples, Morton Oligomer 788 (i.e., Urithane 788) is a urethane acrylate oligomer, Radcure Ebecryl PU 8301 is a hexafunctional urethane acrylate oligomer, Elvacite 2042 (from du Pont) is a high molecular weight poly(ethyl methacrylate), Sartomer 444 is a pentaerythrytol (pentacrylate), Sartomer 272 is a triethylene glycodiacrylate, Rohm & Haas A-11 is a polymethylmethacrylate resin, Rohm & Haas B-72 is a poly(ethyl methacrylate-co-methyl acrylate) resin, HEC 330 PA (from Aqualon) is a hydroxyethyl cellulose, Versa TL 502 (from National Starch) is poly(sodium styrenesulfonate), Orasol Yellow 4GN (from Ciba-Geigy) is a yellow monoazo dye, Irganox 1010 and 1035 (from Ciba-Geigy) are antioxidants, Rohm & Haas B48N is a high molecular weight methylmethacrylate resin having a glass transition temperature of about 50° C., Aerosol OT is a dialkyl ester of sodium sulfosuccinic acid, and TX-100 is an alkylphenol-ethylene oxide adduct. Unless otherwise indicated, all parts, percents, ratios and the like are by weight.

EXAMPLES

Preparation of Crosslinked Nitrile Rubber (J 1411) Dispersions

A highly cross-linked nitrile rubber (Nipol J1411 from Zeon Co.) was extensively swollen in methyl ethyl ketone (MEK) and dispersed in the presence of a polymeric dispersant (Hypermer PS3, from ICI Co.) at 3% (based on J1411) initially by a high speed stirrer at 2000 rpm, then by a microfluidizer at 40 psi inlet pressure. The mean particle size of the J1411 dispersion was about 0.1 $\mu$m.

Preparation of Highly Crosslinked MMA-Graft-Nitrile Rubber (g-Hycar) Dispersions A grafted rubber dispersions was prepared by pre-reacting 6 g of Hycar 1300×30 rubber (an acrylated nitrile butadiene from BF Goodrich), 0.3 g of 2-mercaptobenzoxazole, and 0.03 g of benzoyl peroxide in 14 g of MEK with a mild agitation for 6 hours at 75° C. The resultant oxidized rubber solution was then dispersed in 87 g of an ethanol solution containing 0.72 g of a polymeric dispersant, Hypermer PS-3 (a polyester/polyamine copolymer from ICI Co.), 0.72 g of cetyl alcohol, 0.72 g of Dowfax 2A1 (alkylated diphenyl ether disulfonate surfactant from Dow Chemical), 1.8 g of divinylbenzene, DVB, and 3.0 g of methyl methacrylate, MMA. The dispersion was homogenized 5 passes by a microfluidizer at 40 psi inlet pressure. Finally, the dispersion was charged into a 250 ml flask equipped with a paddle stirrer and allowed to react at 200 rpm, 70° C. under nitrogen for 5 hours. A stable dispersion with an average particle size of 0.86 $\mu$m was obtained.

Preparation of Highly Crosslinked MMA-Graft-Polybutadiene Rubber (g-PB) Dispersions The process was similar to the above preparation of graft nitrile rubber dispersions, except Hycar 1300×33 rubber was substituted with PBD-300 (a low molecular weight acrylate terminated polybutadiene from Atochem Inc.). The mean particle size was about 0.67 $\mu$m.

Preparation of (85/15) BA/DVB Acrylic Rubber Dispersion 3 g of poly(vinyl pyrrolidone). (PVP K-90, Mw 360,000, from GAF Co.) and 0.3 g of Hypermer PS-3 were dissolved in a 120 g ethanol and 20 g water solution with mild agitation at 70° C. Subsequently, 0.15 g of 2,2'-azobisizobutyronitrile, AIBN, 5.1 g of butyl acrylate, BA, and 0.9 g of DVB were charged into the reactor and allowed to react under nitrogen for 30 min. at 70° C. A solution of 20.4 g BA and 3.6 g DVB was then added continuously into the reactor over a period of 30 minutes and the reaction mixture then subjected to a 6 hour post baking at 70° C. A stable dispersion with an average particle size of 0.3 $\mu$m was obtained.

Preparation of (95/5) and (70/30) BA/DVB Acrylic Rubber Dispersions

The process was similar to the preparation of the above (85/15) crosslinked dispersions, except that the divinylbenzene concentrations were 5% and 30% based on the total monomers. In both cases, stable dispersions with mean particle sizes about 0.3 $\mu$m were obtained.

Example 1

An aluminum substrate was electrochemically grained and anodized to give an aluminum oxide surface. The surface was then treated with a polymeric acid to produce an aluminum plate which was suitable for lithographic printing.

Solutions were prepared based on the formulations below with components provided in % dry film:

| Component | 1A | 1B | 1C | 1D | 1E |
|---|---|---|---|---|---|
| Pluronic L43 (from BASF) | 0 | 4.3 | 4.2 | 4.0 | 3.9 |
| Hycar Rubber 1300 × 33 (from B F Goodrich) | 0 | 0 | 2.6 | 2.56 | 2.4 |
| Leuco Crystal Violet | 0 | 0 | 0 | 2.03 | 1.98 |
| p-Toluenesulfonic Acid | 0 | 0 | 0 | 0.7 | 0.7 |
| Sulfosalicyilc Acid | 0 | 0 | 0 | 0.3 | 0.3 |
| Orasol Yellow 4GN (from Ceiba-Geigy) | 0 | 0 | 0 | 0.4 | 0.4 |
| Tetramethylammonium Tetraphenylborate | 0 | 0 | 0 | 0.25 | 0.24 |
| 2,2'-bis(o-chlorophenyl)-4,4',5,5'-tetraphenyl-1,2-biimidazole | 0 | 0 | 0 | 0 | 2.4 |
| Polymer Elvacite 2042 | 40.1 | 38.4 | 37.4 | 35.9 | 35.1 |
| Cab-o-Sil M5 Silica | 1.12 | 1.07 | 1.04 | 1.00 | 0.99 |
| Trimethylolpropane triacrylate | 16.2 | 15.5 | 15.1 | 14.5 | 14.2 |
| Sartomer 444 | 21.5 | 20.9 | 20.1 | 19.2 | 18.7 |
| Sartomer 272 | 3.4 | 3.3 | 3.2 | 3.0 | 3.0 |
| 1,6-Hexanediol Diacrylate | 13.7 | 13.1 | 12.8 | 12.3 | 12.0 |
| 2- and 4-isopropylthioxanthone | 0.7 | 0.67 | 0.65 | 0.63 | 0.61 |
| 2,6-diisopropyl-N,N-dimethylaniline | 3.4 | 3.3 | 3.2 | 3.0 | 3.0 |

The above formulations were each dissolved in 4:3 MEK/n-butanol to make 5.5% solutions, coated immediately using a #9 Meyer Rod for an aimed thickness of 1 $\mu$m, and dried in a circulating air oven at 70° C. for 10 minutes. The coated and dried plates were then stored in the dark for at least 16 hours.

The coated plates were subsequently exposed to actinic radiation of 60 light units from a standard mercury halide lamp, which had an emission peak in the ultraviolet range at 364 nm. The plates were exposed through a UGRA target mask to produce a test image. A sample plate for each formulation was then developed with a mixture of ink and fountain solution using a Garnet Abrasion Machine. The inked images were then read from the plates.

The Garnet machine developed plates were compared for their ink receptivity and extent of development in the non-image areas. Plate formulation 1A (no L43 surfactant, Hycar rubber or dye system components) was totally inked, showing no image or cleanout in unexposed areas. Plate formulation 1B. (L43 surfactant at 4.3%) showed greatly improved image discrimination: Step Dmax 10, step Dmin 15. Scumming was, however, observed in the non-image areas. Plate formulation 1C (L43 surfactant at 4.3%, Hycar 1300×33 rubber at 2.6%) showed increased ink density (step Dmax >10), but also increased scumming in the non-imaged areas. Plate formulation 1D (L43 surfactant at 4.3%, Hycar 1300×33 rubber at 2.6%, and all dye system components except 2,2'-bis(o-chlorophenyl)-4,4',5,5'-tetraphenyl- 1,2-biimidazole) showed excellent cleanout in the non-image areas, but a decrease in ink receptibility: Step Dmax 5, step Dmin 10. Plate formulation 1E (L43 surfactant at 4.3%, Hycar 1300×33 rubber at 2.6%, and all dye system components, including 2,2'-bis(o-chlorophenyl-4,4', 5,5'-tetraphenyl-1,2-biimidazole) showed almost identical development and ink receptibility as Plate 1D: Step Dmax 5, step Dmin 12.

From this example, it was discerned that a surfactant such a Pluronic L43 brought about development and cleanout in the non-imaged areas, and that rubber or rubber precursors, such as Hycar 1300×33, dramatically increased ink receptibility, but resulted in scumming in non-imaged areas. It was further discerned that the decrease in inking resulted from the hydrophilic nature of the dye system components and, as this occurs with or without biimidazole, not to dye chemistry competition with crosslinked gel formation in the resist imaging process.

Example 2

Solutions were prepared based on the formulations below with components provided in % weight dry film:

| Components | 2A | 2B |
|---|---|---|
| Acryloid Resin B-72 (from Rohm & Haas) | 17.0 | 13.0 |
| Hycar 1300 × 33 (from B F Goodrich) | 0.0 | 4.0 |
| Acryloid Resin A11 (from Rohm & Haas) | 6.5 | 6.5 |
| Radcure Ebecryl PU8301 | 26.07 | 26.07 |
| Morton Oligomer 788 | 16.52 | 16.52 |
| Trimethylolpropane triacrylate | 11.59 | 11.59 |
| Cab-o-sil M-5 silica | 3.0 | 3.0 |
| 4,4'-bis(N,N-diethylamino) benzophenone | 0.4 | 0.4 |
| 4-(p-tolylmercapto) benzophenone | 1.8 | 1.8 |
| 2,2'-bis(o-chlorophenyl)-4,4',5,5' tetraphenyl-1,2-biimidazole | 3.5 | 3.5 |
| Leuco Crystal Violet | 2.8 | 2.8 |
| Diphenyl phosphate | 2.25 | 2.25 |
| 2,6-diisopropyl-N,N-dimethylaniline | 2.25 | 2.25 |
| Triethylene glycol diacetate | 5.50 | 5.50 |
| Lithium chloride | 0.62 | 0.62 |
| 2,6-di-tert-butyl-4-methylphenol (BHT) | 0.1 | 0.1 |
| Irganox 1035 (from Ciba-Geigy) | 0.1 | 0.1 |

The two compositions were diluted to 4.5% in a mixture of solvents (MEK/toluene/n-butanol/cyclohexanone=85/6/5/4), spin-coated on an anodized aluminum plates at 200 rpm, dried at room temperature for 3 minutes and then at 70° C. for 1 minute. Each plate was cut into two identical sections and exposed through a standard UGRA mask under identical conditions. One section was hand developed with an aqueous developer (sold under the trade name ND-143 by Hoechst Celanese Corporation, Printing Products Division, Branchburg, N.J.), and the other was developed directly on a Multigraphics printing press.

Plate 2B (with rubber) consistently showed significantly better highlight resolution (2% dot on paper and aluminum) than Plate 2A (without rubber, 4% dot). Ink receptibility and durability were also improved significantly by the addition of the Hycar rubber 1300×33. After 5000 impressions, Plate 2A (without rubber) showed a dramatic degradation of resolution on the paper (10%), even though resolution on aluminum remained at 4%. In contrast, the highlight resolution of Plate 2B (with rubber) on paper remained almost unchanged.

Further, it was observed that although the addition of the Hycar rubber resulted in significant improvements in durability, ink receptibility and highlight resolution, the addition also reduced the on-press developability dramatically. In comparison, however, Plate 2A (no rubber) could not be developed on-press at all.

Example 3

Solutions were made based on the following formulations with components provided in % weight dry film:

| Component | 3A | 3B | 3C |
|---|---|---|---|
| Rohm and Haas Resin B48N | 23.0 | 23.0 | 23.0 |
| Radcure Ebecryl PU 8301 | 30.56 | 30.56 | 30.56 |
| Morton Oligomer 788 | 8.45 | 8.45 | 8.45 |
| Cab-o-sil M5 Silica | 1.12 | 1.12 | 1.12 |
| 2-isopropylthioxanthone | 0.61 | 0.61 | 0.61 |
| 2,2'-bis(o-chlorophenyl)-4,4',5,5'-tetraphenyl-1,2-biimidazole | 3.58 | 3.58 | 3.58 |
| P-toluene sulfonic acid | 0.67 | 0.67 | 0.67 |
| 2,6-diisopropyl-N,N-dimethyl aniline | 2.8 | 2.8 | 2.8 |
| Lithium Chloride | 0.56 | 0.56 | 0.56 |
| B. F. Goodrich Hycar 1300 × 33 | 7.0 | 7.0 | 7.0 |
| Leuco Crystal Violet | 3.2 | 3.2 | 3.2 |
| Triethylene glycol diacetate | 6.6 | 6.6 | 6.6 |
| BHT | 0.1 | 0.1 | 0.1 |
| Irganox 1035 | 0.1 | 0.1 | 0.1 |
| BASF Pluronic L43 | 7.0 | 6.0 | 5.5 |
| Trimethylolpropane triacrylate, TMPTA | 7.86 | 8.86 | 9.36 |
| Press Results | | | |
| Impressions Needed For Clean Background | 15 | 50 | >1000 |
| Step No. for Dmax at Startup | 8 | 8 | * |
| Step No. for Dmax after 1000 impressions | 7 | 8 | * |

The three compositions formulations above differ in the concentration of surfactant L43 and the monomer TMPTA.

Each composition was diluted to 4% with a mixture of solvents (MEK/cyclohexanone=89.5/6.5), spin-coated onto anodized aluminum substrates at 200 RPM, dried at 70° C. for 5 minutes, exposed through a standard UGRA scale for 40 light units, and run on a Multigraphics 1250 printing press without intermediary chemical development. Plate 3C, having the least amount of Pluronic surfactant L43 (HLB 7–12), failed to develop on the press, even after 1000 impressions. Plate 3A, having the highest amount of surfactant, developed a high contrast image with a clean background within 15 impressions. However, the step number for Dmax fell from 8 to 7 after 1000 impressions. It was accordingly surmised that low HLB (7–12) surfactant, such as L43, enhanced development, but excessive amounts reduced durability.

Example 4

Solutions were prepared based on the formulations below with the components in % dry film:

| Components | 4A | 4B |
|---|---|---|
| Pluronic L43 (from BASF) | 6 | 6 |
| Rubber PBD300 (from Atochem, Inc.) | 0 | 2 |
| Leuco Crystal Violet | 2.98 | 2.98 |
| p-Toluenesulfonic Acid | 0.8 | 0.8 |
| Sulfosalicilic Acid | 0.4 | 0.4 |
| Orisol Yellow 4GN (Ciba-Geigy) | 0.48 | 0.48 |
| Tetramethylammonium tetraphenylborate | 0.2 | 0.2 |
| 2,2'-bis(o-chlorophenyl)-4,4',5,5'-tetrapheynyl-1,2-biimidazole | 2 | 2 |
| Polymer Elvacite 2042 | 40.07 | 40.07 |
| Cab-o-sil M5 Silica | 1 | 1 |
| Trimethylolpropane Triacrylate | 21.84 | 21.84 |
| Sartomer 444 | 21.84 | 21.84 |
| Sartomer 272 | 3.4 | 3.4 |
| 2- and 4-isopropylthioxanthone | 0.48 | 0.48 |
| 2,6-diisopropyl-N,N-dimethylaniline | 2 | 2 |
| Pluronic 10R5 (from BASF) | 2 | 2 |
| Irganox 1010 (from Ciba-Geigy) | 0.2 | 0.2 |
| Irganox 1035 (from Ciba-Geigy) | 0.2 | 0.2 |
| 4-Methoxyphenol | 0.1 | 0.1 |

The above formulations were dissolved in MEK and n-butanol to make solutions which were 5.5% total solids. Aluminum substrates were coated with these formulations using a #11 Meyer Rod for an aimed thickness of 1.4 μm. The coated plates were dried in a circulating air oven at 70° C. for 10 minutes. The coated and dried plates were then stored in the dark for a minimum of 16 hours.

The coated plates were then exposed to actinic radiation through a UGRA target mask to produce a test image. The exposure was at 80 light units from a standard mercury halide lamp which had an emission peak in the ultraviolet range at 364 nm. A sample plate for each formulation was developed using a solution of 60% ethyl acetate and 40% hexane, washed with 50% ethyl acetate and 50% hexane, and dried in a 70° C. oven for 10 minutes. The developed images were subsequently inked using ink and fountain solution, and the inked images read.

The solvent developed plates were compared for their ink receptibility and extent of development in the non-imaged areas. Plate 4A, with L43 surfactant, showed a weak ink image (step Dmax 3, step Dmin 9). In comparison, Plate 4B, with L43 surfactant at 6% and Rubber PBD300 at 2% showed a strong ink image with an increased ink density (step Dmax 6, step Dmin4). It was again surmised that rubber or rubber precursors such as Rubber PBD300 are capable of dramatically increasing the ink receptibility of presensitized lithographic printing plates.

Example 5

Solutions were prepared based on the formulations below with the components in % w/w (Rubber is in % dry solid):

| Components | 5A | 5B |
|---|---|---|
| B F Goodrich Hycar Rubber 1300 x 33 | 3.00 | — |
| Zeon Rubber, Nipol J1411 dispersion | — | 3.00 |
| Acryloid Resin A-11 (from Rohm & Haas) | 6.5 | 6.5 |
| Acryloid Resin B-72 (from Rohm & Haas) | 13.0 | 13.0 |
| ICI Hypermer PS3 | 0.15 | 0.15 |
| Cab-o-sil M5 Silica | 3.00 | 3.00 |
| Radcure urethane Ebecryl 8301 | 29.07 | 29.07 |
| Morton oligomer 788 | 12.93 | 12.93 |
| Trimethylolpropane triacrylate | 7.78 | 557.78 |
| Triethylene glycol diacetate | 5.20 | 5.20 |
| 3-benzoyl-7-methoxy coumarin | 1.40 | 1.40 |
| 4-(p-tolylmercapto) benzophenone | 1.60 | 1.60 |
| 2,6-diisopropyl-N,Ndimethylaniline | 2.50 | 2.50 |
| BASF Pluronic Surfactant L43 | 5.00 | 5.00 |
| Leuco Crystal Violet | 2.54 | 2.54 |
| Diphenyl phosphate | 2.10 | 2.10 |
| 2,2'-bis(o-chlorophenyl)-4,4',5,5'-tetraphenyl-1.2-biimidazole | 3.50 | 3.50 |
| Lithium Chloride | 0.50 | 0.50 |
| BHT | 0.14 | 0.14 |
| Irganox 1035 | 0.10 | 0.10 |

Compositions 5A and 5B differ in the use of a methacrylate terminated low molecular weight (acrylonitrile-butadiene) rubber (Hycar 1300x33 from BF Goodrich Co.) in composition 5A, and the alternative use of highly crosslinked nitrile rubber J1411 dispersion in composition 5B.

Both compositions were diluted to 4.5% by a mixture of solvents (MEK/n-butanol/cyclohexanone/toluene=22/1/1/1), spin-coated onto anodized aluminum substrates at 150 rpm, dried at 70° C. for 5 minutes, exposed through a standard UGRA mask, and on-press developed on a Komori press. Both plates developed well with clean background within 15 to 50 impressions on the press and showed comparable resolution and durability. However, Plate 5B with the pre-cross linked rubber dispersion showed a slightly faster rate of development and significantly less tackiness than Plate 5A.

To measure tackiness, the plates were cut into one inch strips and laminated with 4 mil duPont P4C1A polyester cover sheets. The 90 degree peel strength was measured by a TLMI peel tester from Test Measurement Co. The measured relative peel strengths were 64 for Plate 5A (Hycar 1300x33) and 48 for Plates 5B (J1411), respectively.

Example 6

Solutions were made based on the following formulations with components measured in w/w % (Rubber is in % dry solid):

| Component | 6A | 6B | 6C |
|---|---|---|---|
| Zeon Rubber, Nipon J1411 dispersion | 4.0 | — | — |
| g-Hycar 2300 x 33 dispersion | — | 4.0 | — |
| g-PB dispersion | — | — | 4.0 |
| Rohm and Haas Resin A11 | 6.5 | 6.5 | 6.5 |
| Rohm and Haas Resin B72 | 13.0 | 13.0 | 13.0 |
| Cab-o-sil M5 Silica | 2.0 | 2.0 | 2.0 |
| Radcure Ebecryl PU 8301 | 29.07 | 29.07 | 29.07 |
| Morton Oligomer 788 | 12.92 | 12.92 | 12.92 |
| Trimethylolpropane triacrylate, TMPTA | 7.78 | 7.78 | 7.78 |
| Triethylene glycol diacetate | 5.0 | 5.0 | 5.0 |
| 3-benzoyl-7-methoxy coumarin | 1.8 | 1.8 | 1.8 |
| 4-(p-tolylmercapto) benzophenone | 1.6 | 1.6 | 1.6 |
| 2,6-diisopropyl-N,N-dimethylaniline | 2.2 | 2.2 | 2.2 |
| BASF Pluronic Surfactant L43 | 5.0 | 5.0 | 5.0 |
| Leuco Crystal Violet | 2.72 | 2.72 | 2.72 |
| Diphenyl Phosphate | 2.0 | 2.0 | 2.0 |
| 2,2'-bis(o-chlorophenyl)-4,4',5,5'-tetraphenyl-1,2-biimidazole | 3.5 | 3.5 | 3.5 |
| Lithium Chloride | 0.5 | 0.5 | 0.5 |
| BHT | 0.23 | 0.23 | 0.23 |
| Irganox 1035 (from Ciba-Geigy) | 0.39 | 0.3 | 0.3 |

Compositions 6B and 6C were similar to Composition 6A except for the substitution of J1411 rubber dispersion with the previously described highly cross-linked MMA-graft-nitrile rubber (g-Hycar) in Composition 6B and with MMA-graft-polybutadiene (g-PB) dispersion in Composition 6C.

Plates made from each of the compositions developed well with clean background within 15 to 50 impressions on the press. Compared to the J1411 dispersion, both of the highly crosslinked grafted rubber dispersions showed a noticeable reduction in tackiness of the non-exposed plates. The g-Hycar dispersion also resulted in better resolution and exposure latitude than J1411 and g-PB dispersions. Results are tabulated in the following table (with highlight dot and shadow dot measured @ 3000 impressions):

| Example | Rubber | Relative Tackiness | Relative Exposure | Highlight Dot | Shadow Dot |
|---|---|---|---|---|---|
| 6A | J1411 | >48 | 40 | 5% | 90% |
|  |  |  | 60 | 2% | 80% |
| 6B | g-Hycar | 37 | 40 | 2% | 90% |
|  |  |  | 60 | 2% | 90% |
| 6C |  | 36 | 40 | 3% | 90% |
|  |  |  | 60 | 2% | 80% |

Example 7

Three compositions, Composition 7A, 7B, and 7C, were prepared similar to Composition 6A, except for the substitution of the J1411 rubber dispersion with (95/5), (85/15), and (70/30) BA/DVB crosslinked acrylic rubber dispersions, respectively. The (95/5) dispersion was highly swollen by the MEK/butanol/toluene coating solvents and resulted in a very viscous coating solution. Corresponding Plate 7A (with 95/5) was very non-uniform and was too tacky to be evaluated. In contrast, corresponding Plates 7B (85/15) and 7C (70/30) were significantly less tacky and on-press developed well. Compared to the Example 6A (J1411 dispersion), both Plate 7B (85/15) and 7C (70/30) exhibited about the same tackiness. Plate 7B showed improved image resolution.

Results are tabulated in the following table (with highlight dot and shadow dot measured @3000 impressions):

| Example | Rubber | Relative Tackiness | Relative Exposure | Highlight Dot | Shadow Dot |
|---|---|---|---|---|---|
| 6A | J1411 |  | 40 | 5% | 90% |
|  |  |  | 60 | 2% | 80% |
| 7A | 95/5 | *** | n/a | n/a | n/a |
| 7B | 85/15 |  | 40 | 2% | 90% |
|  |  |  | 60 | 1% | 90% |
| 7C | 70/30 |  | 40 | 10% | 90% |
|  |  |  | 60 | 2% | 80% |

*** Very poor quality coating.

Example 8

Solutions were prepared based on the formulations below with components provided in % w/w:

| Component | 8A | 8B | 8C | 8D | 8E |
|---|---|---|---|---|---|
| Acryloid Resin B-72 (from Rohm & Haas) | 15.69 | 15.69 | 15.69 | 15.69 | 15.59 |
| Hycar Rubber 1300 × 33 (from B F Goodrich) | 2.41 | 2.41 | 2.41 | 2.41 | 2.41 |
| Acryloid Resin A-11 (from Rohm & Haas) | 7.85 | 7.85 | 7.85 | 7.85 | 7.85 |
| Radcure Ebecryl PU8301 | 33.89 | 33.89 | 33.89 | 33.89 | 33.89 |
| Morton Oligomer 788 | 9.13 | 9.13 | 9.13 | 9.13 | 9.13 |
| Tetramethylolpropane triacrylate | 15.09 | 15.09 | 15.09 | 15.09 | 15.09 |
| Cab-o-sil M5 Silica | 3.62 | 3.62 | 3.62 | 3.62 | 3.62 |
| 4,4'-bis(N,N-diethylamino)benzophenone | 0.48 | 0.48 | 0.48 | 0.48 | 0.48 |
| 4-(p-tolylmercapto)benzophenone | 2.18 | 2.18 | 2.18 | 2.18 | 2.18 |
| 2,2'-bis(o-chlorophenyl)-4,4',5,5'-tetraphenyl-1,2-biimidazole | 4.22 | 4.22 | 4.22 | 4.22 | 4.22 |
| Diphenyl phosphoric acid | 2.72 | 2.72 | 2.72 | 2.72 | 2.72 |
| 2,6-isopropyl-N,N-dimethylaniline | 2.72 | 2.72 | 2.72 | 2.72 | 2.72 |
| Pluronic L61 (HLB 1–7) | 0 | 7.5 | 0 | 0 | 0 |
| Pluronic L43 (HLB 7–12) | 0 | 0 | 7.5 | 0 | 0 |
| Pluronic 10R5 (HLB 12–18) | 0 | 0 | 0 | 7.5 | 0 |
| Pluronic 1107 (HLB > 24) | 0 | 0 | 0 | 0 | 7.5 |

Compositions 8C, 8D, and 8E differed from Composition 8B with regard to surfactants.

The formulations were diluted to 4.3% in a mixture of solvents (MEK/toluene/n-butanol/cyclohexanone=300/20/17/13) and coated on anodized aluminum plates by a #11 Meyer Rod. The plates were then dried for an additional hour before they were wetted with an excess of fountain solution and subsequently developed by hand-rubbing with ink.

Results are provided in the following table:

| Composition | Surfactant | HLB | Observations |
|---|---|---|---|
| 8A | none | — | No Development. |
| 8B | L61 | 1–7 | Scum. |
| 8C | L43 | 7–12 | Good, clean background. |
| 8D | 10R5 | 12–18 | Good, clean background. |
| 8E | 1107 | >24 | Low ink receptibility, poor durability. |

It was surmised from the above table that the acceptable range of HLB values for the surfactant is 7–18. A low HLB (<7) surfactant would result in a poor development on press. In contrast a high HLB (>18) surfactant would tend to degrade the ink receptability and durability of the image. The preferred HLB range is about 9–13.

Example 9

A photoresist solution with 7% of solid was made according to the formulation set forth below. Acrylated Nitrile Butadiene (Hycar 1300×33, from BF Goodrich) was selected for the rubber component.

| Component | % (w/w) |
|---|---|
| Photoreactive Acrylic Binder* | 51.75 |
| Ebecryl 8301 oligomer (from Radcure) | 17.42 |
| Trimethylolpropane triacrylate | 4.68 |
| Polyurethane PU788 (from Morton) | 7.74 |
| Acrylated Nitrile Butadiene (Hycar 1300 × 33 from B F Goodrich) | 4.00 |
| 3-benzoyl-7-methoxy coumarin** | 1.40 |
| 4-benzoyl-4-methyl diphenyl sulfide** | 1.80 |
| 2-phenyl-4,6-bis-(trichloromethyl-5-triazine)** | 2.21 |
| Triethylene glycol diacctate | 3.50 |
| Leuco Crystal Violet Dye | 2.77 |

-continued

| Component | % (w/w) |
|---|---|
| 2,6-di-tert-butyl-4-methyl phenol (BHT)*** | 0.13 |
| Irganox 1035 (from Ciba-Geigy) | 0.10 |
| Pluronic L43 Surfactant (from BASF) | 2.50 |

*The photoreactive binder was prepared from methyl methacrylate, butyl methacrylate, maleic anhydride and an m-TMI adduct with hydroxybutyl acrylate. See, U.S. Pat. No. 5514,522
**Radical initiator.
***Antioxidant.

The photoresist composition was coated onto an anodized aluminum plate by continuous roll coating, exposed to actinic radiation, then on-press developed. On-press development of the photoresist was effectuated by the agency of high-boiling, low-vapor pressure developers liberated from ruptured microcapsules coated atop the photoresist.

The microcapsules were prepared by first dissolving 8.0 g HEC 330 PA (from Hercules), 3.9 g Versa TL 502 (from National Starch), 0.06 g Aerosol OT (from Fisher) in 425 g $H_2O$. A mixture of 21.5 g gamma nonalactone, 89.5 g dibutyl phthalate, and 11.1 g Desmodur N-100 (from Miles) was then dispersed into the aqueous phase at 1500 rpm for 10 minutes. To encourage the formation of prewall, a small amount of dibutyl tin dilaurate (0.12 g) was added into the oleophilic phase. 1.4 g of triethylene tetramine was added and allowed to react for 2 hours at room temperature. 41.1 g of a melamine-formaldehyde prepolymer (Cymel 385, from American Cyanamid) was added and the pH adjusted to between 5 and 5.5 with 1N sulfuric acid. The reaction was continued at 65° C. for one hour. 10.0 g of urea were added to react for one hour to quench all residual formaldehyde and/or melamine-formaldehyde condensate in the mixture. Sodium Chloride (18.3 g) was added and the pH was brought to 9 and the reaction allowed to continue for 30 minutes, then slowly cooled to 25° C. The microcapsules were washed extensively with deionized water in a centrifuge.

A microcapsule-containing coating solution was subsequently prepared utilizing 9.45 g microcapsules (at 39.7% w/v), 0.47 g Silica 2040 (at 40% w/v), 1.13 g PVA 205 (at 10% w/v), 2.24 g Pluronic L43 surfactant (at 5% w/v); T×100 surfactant (at 10% w/v), 0.06 g LiCl (at 2% w/v) and 11.47 g $H_2O$.

The microcapsule-containing coating solution was coated atop the photoresist. After exposing the plate to 40 UV light units, the plate was run through a pressure roller then mounted and ran on a Multigraphics 1250 lithographic printing press. The plate on-press developed within 20 impressions.

We claim:

1. A photoresist composition suitable for use as a photoresist in an on-press developable lithographic printing plate, the photoresist composition comprising in an organic solvent a photopolymerizable ethylenically unsaturated monomer having at least one terminal ethylenic group capable of forming a high polymer by free radical initiated, chain-propagated addition polymerization;

a free-radical generating, addition polymerization-initiating system activatable by actinic radiation;

a hydrophobic macromolecular organic binder;

a particulate rubber incorporated into the photoresist composition as a stable dispersion; and a surfactant having a concentration and an HLB value effective for stably dispersing the particulate rubber.

2. The photoresist composition of claim 1, wherein the surfactant has an HLB value between approximately 7.0 to approximately 18.0.

3. The photoresist composition of claim 1, wherein the particulate rubber has an average size from approximately 0.05 μm to approximately 5.0 μm.

4. The photoresist composition of claim 1, wherein the particulate rubber is synthesized from an acrylate grafted polybutadiene.

5. The photoresist composition of claim 1, wherein the particulate rubber is synthesized from a carboxy-terminated poly(butadiene/acrylonitrile/acrylic acid)terpolymers.

6. The photoresist composition of claim 1, wherein the particulate rubber is synthesized from an acrylate terminated polybutadiene.

7. The photoresist composition of claim 1, wherein the concentration of said monomer is 7.5% to about 70% by weight based on the total solids of the photoresist composition.

8. The photoresist composition of claim 7, wherein the concentration of said monomer is between 15% and 40% by weight based on total solids of the photoresist composition.

9. The photoresist composition of claim 1, wherein said hydrophobic macromolecular organic binder is a photoreactive acrylic binder.

* * * * *